(12) United States Patent
Loh et al.

(10) Patent No.: US 11,050,214 B2
(45) Date of Patent: Jun. 29, 2021

(54) NARROW-LINEWIDTH MICROCAVITY BRILLOUIN LASER WITH SUPPRESSED TEMPERATURE FLUCTUATIONS

(71) Applicant: Massachusetts Institute of Technology, Cambridge, MA (US)

(72) Inventors: William Loh, Cambridge, MA (US); Paul William Juodawlkis, Arlington, MA (US); Siva Yegnanarayanan, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 118 days.

(21) Appl. No.: 16/401,750

(22) Filed: May 2, 2019

(65) Prior Publication Data

US 2019/0341739 A1  Nov. 7, 2019

Related U.S. Application Data

(60) Provisional application No. 62/665,605, filed on May 2, 2018.

(51) Int. Cl.
*H01S 3/30* (2006.01)
*H01S 3/094* (2006.01)
(Continued)

(52) U.S. Cl.
CPC ........ *H01S 3/302* (2013.01); *H01S 3/094003* (2013.01); *H01S 3/094053* (2013.01); *H01S 3/094069* (2013.01); *H01S 3/094096* (2013.01); *H01S 3/1305* (2013.01); *H01S 3/1312* (2013.01); *H01S 3/1317* (2013.01); *H01S 3/2383* (2013.01); *H01S 5/0687* (2013.01);
(Continued)

(58) Field of Classification Search
CPC .. H01S 3/30–302; H01S 3/102; H01S 3/1022; H01S 3/1028; H01S 3/131; H01S 3/1312; H01S 3/1317; H01S 3/1305
See application file for complete search history.

(56) References Cited

U.S. PATENT DOCUMENTS

| 4,159,178 A | 6/1979 | Vali et al. |
| 7,072,367 B2 | 7/2006 | Arisawa et al. |

(Continued)

OTHER PUBLICATIONS

Abbott et al., "Observation of gravitational waves from a binary black hole merger." Physical review letters 116.6 (2016): 061102, 16 pages.
(Continued)

*Primary Examiner* — Tod T Van Roy
*Assistant Examiner* — Sean P Hagan
(74) *Attorney, Agent, or Firm* — Smith Baluch LLP

(57) ABSTRACT

In an ultrastable laser, using a large mode-volume optical resonator, which suppresses the resonator's fast thermal fluctuations, together with the stimulated Brillouin scattering (SBS) optical nonlinearity presents a powerful combination that enables the ability to lase with an ultra-narrow linewidth of 20 Hz. The laser's long-term temperature drift is compensated by using the narrow Brillouin line to sense minute changes in the resonator's temperature (e.g., changes of 85 nK). The precision of this temperature measurement enables the stabilization of resonators against environmental perturbations.

16 Claims, 6 Drawing Sheets

(51) Int. Cl.
| | |
|---|---|
| *H01S 3/13* | (2006.01) |
| *H01S 3/131* | (2006.01) |
| *H01S 3/23* | (2006.01) |
| *H01S 5/0687* | (2006.01) |
| *H01S 3/0941* | (2006.01) |
| *H01S 3/10* | (2006.01) |

(52) U.S. Cl.
CPC ....... *H01S 3/09415* (2013.01); *H01S 3/10053* (2013.01); *H01S 3/10061* (2013.01)

(56) References Cited

U.S. PATENT DOCUMENTS

| | | | | |
|---|---|---|---|---|
| 7,272,160 | B1* | 9/2007 | Geng | H01S 3/302 372/29.011 |
| 2001/0033595 | A1* | 10/2001 | Miyake | H01S 3/168 372/66 |
| 2003/0002138 | A1* | 1/2003 | DeCusatis | H01S 3/302 359/334 |
| 2003/0021301 | A1* | 1/2003 | Vahala | H01S 3/30 372/3 |
| 2003/0048815 | A1* | 3/2003 | Cook | H01S 3/067 372/3 |
| 2005/0286602 | A1* | 12/2005 | Gunn | G02B 6/12007 372/94 |
| 2010/0315642 | A1* | 12/2010 | Chow | G01J 3/433 356/432 |
| 2015/0377656 | A1 | 12/2015 | Bastianini | |
| 2019/0317379 | A1* | 10/2019 | Herr | H01S 3/0092 |

OTHER PUBLICATIONS

Bloom et al., "An optical lattice clock with accuracy and stability at the 10-18 level." Nature 506.7486 (2014): 71, 7 pages.
Carmon et al., "Dynamical thermal behavior and thermal self-stability of microcavities." Optics Express 12.20 (2004): 4742-4750.
Day et al., "Sub-hertz relative frequency stabilization of two-diode laser-pumped Nd: YAG lasers locked to a Fabry-Perot interferometer." IEEE Journal of Quantum Electronics 28.4 (1992): 1106-1117.
Debut et al., "Linewidth narrowing in Brillouin lasers: Theoretical analysis." Physical Review A 62.2 (2000): 023803, 4 pages.
Del'Haye et al., "Optical frequency comb generation from a monolithic microresonator." Nature 450.7173 (2007): 1214, 4 pages.
Del'Haye et al., "Laser-machined ultra-high-Q microrod resonators for nonlinear optics." Applied Physics Letters 102.22 (2013): 221119, 5 pages.
Drever et al., "Laser phase and frequency stabilization using an optical resonator." Applied Physics B31.2 (1983): 97-105.
Fescenko et al., "Dual-mode temperature compensation technique for laser stabilization to a crystalline whispering gallery mode resonator." Optics Express 20.17 (2012): 19185-19193.
Fortier et al., "Generation of ultrastable microwaves via optical frequency division." Nature Photonics 5.7 (2011): 425, 5 pages.
Geng et al., "Highly stable low-noise Brillouin fiber laser with ultranarrow spectral linewidth." IEEE Photonics Technology Letters 18.17 (2006): 1813-1815.
Gorodetsky et al., "Fundamental thermal fluctuations in microspheres." JOSA B 21.4 (2004): 697-705.
Gorodetsky et al., "The measurement of thermo-refractive noise in microspheres." Laser Resonators and Beam Control VI. vol. 4969. International Society for Optics and Photonics, 2003, 13 pages.
Grudinin et al., "Brillouin lasing with a CaF 2 whispering gallery mode resonator." Physical review letters 102.4 (2009): 043902, 4 pages.
Häffner et al., "Quantum computing with trapped ions." Physics reports 469.4 (2008): 155-203.

Hausmann et al., "Integrated high-quality factor optical resonators in diamond." Nano letters 13.5 (2013): 1898-1902.
Hinkley et al., "An atomic clock with 10-18 instability." Science 341.6151 (2013): 1215-1218.
Hjelme et al., "Semiconductor laser stabilization by external optical feedback." IEEE Journal of Quantum Electronics 27.3 (1991): 352-372.
International Search Report and Written Opinion in International Patent Application No. PCT/US19/30407 dated Jul. 17, 2019, 14 pages.
Ippen et al., "Stimulated Brillouin scattering in optical fibers." Applied Physics Letters 21.11 (1972): 539-541.
Ji et al., "Ultra-low-loss on-chip resonators with sub-milliwatt parametric oscillation threshold." Optica 4.6 (2017): 619-624.
Kabakova et al., "Narrow linewidth Brillouin laser based on chalcogenide photonic chip." Optics letters 38.17 (2013): 3208-3211.
Kessler et al., "A sub-40-mHz-linewidth laser based on a silicon single-crystal optical cavity." Nature Photonics 6.10 (2012): 687, 6 pages.
Kippenberg et al., "Microresonator-based optical frequency combs." Science 332.6029 (2011): 555-559.
Koller et al., "Transportable optical lattice clock with 7× 10− 17 uncertainty." Physical review letters 118.7 (2017): 073601, 6 pages.
Latawiec et al., "On-chip diamond Raman laser." Optica 2.11 (2015): 924-928.
Lee et al., "Chemically etched ultrahigh-Q wedge-resonator on a silicon chip." Nature Photonics 6.6 (2012): 369, 5 pages.
Leibrandt et al., "Spherical reference cavities for frequency stabilization of lasers in non-laboratory environments." Optics Express 19.4 (2011): 3471-3482.
Liang et al., "Ultralow noise miniature external cavity semiconductor laser." Nature communications 6 (2015): 7371, 6 pages.
Loh et al., "A microrod-resonator Brillouin laser with 240 Hz absolute linewidth." New Journal of Physics 18.4 (2016): 045001, 10 pages.
Loh et al., "Dual-microcavity narrow-linewidth Brillouin laser." Optica 2.3 (2015): 225-232.
Ludlow et al., "Compact, thermal-noise-limited optical cavity for diode laser stabilization at 1× 10− 15." Optics letters 32.6 (2007): 641-643.
Matsko et al., "Whispering-gallery-mode resonators as frequency references. I. Fundamental limitations." JOSA B24.6 (2007): 1324-1335.
Rafac et al., "Sub-dekahertz ultraviolet spectroscopy of 199 Hg+." Physical Review Letters 85.12 (2000): 2462, 4 pages.
Salomon et al., "Laser stabilization at the millihertz level." JOSA B 5.8 (1988): 1576-1587.
Savchenkov et al., "Tunable filter based on whispering gallery modes." Electronics Letters 39.4 (2003): 389-391.
Smith et al., "Narrow-linewidth stimulated Brillouin fiber laser and applications." Optics Letters 16.6 (1991): 393-395.
Spillane et al., "Ultralow-threshold Raman laser using a spherical dielectric microcavity." Nature 415.6872 (2002): 621, 3 pages.
Strekalov et al., "Temperature measurement and stabilization in a birefringent whispering gallery mode resonator. " Optics Express 19.15 (2011): 14495-14501.
Vahala, "Optical microcavities." nature 424.6950 (2003): 839, 8 pages.
Weng et al., "Nano-Kelvin thermometry and temperature control: beyond the thermal noise limit." Physical review letters 112.16 (2014): 160801, 5 pages.
Xuan et al., "High-Q silicon nitride microresonators exhibiting low-power frequency comb initiation." Optica 3.11 1171-1180. (2016): 1171-1180.
Yariv, "Critical Coupling and Its Control in Optical Waveguide-Ring Resonator Systems," IEEE Photonics Technology Letters 14:483-485 (Apr. 2002).

* cited by examiner

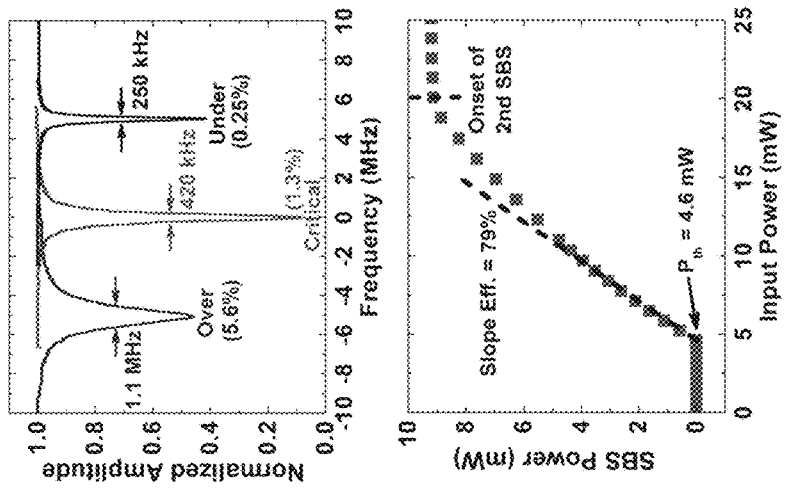
FIG. 1B
FIG. 1C
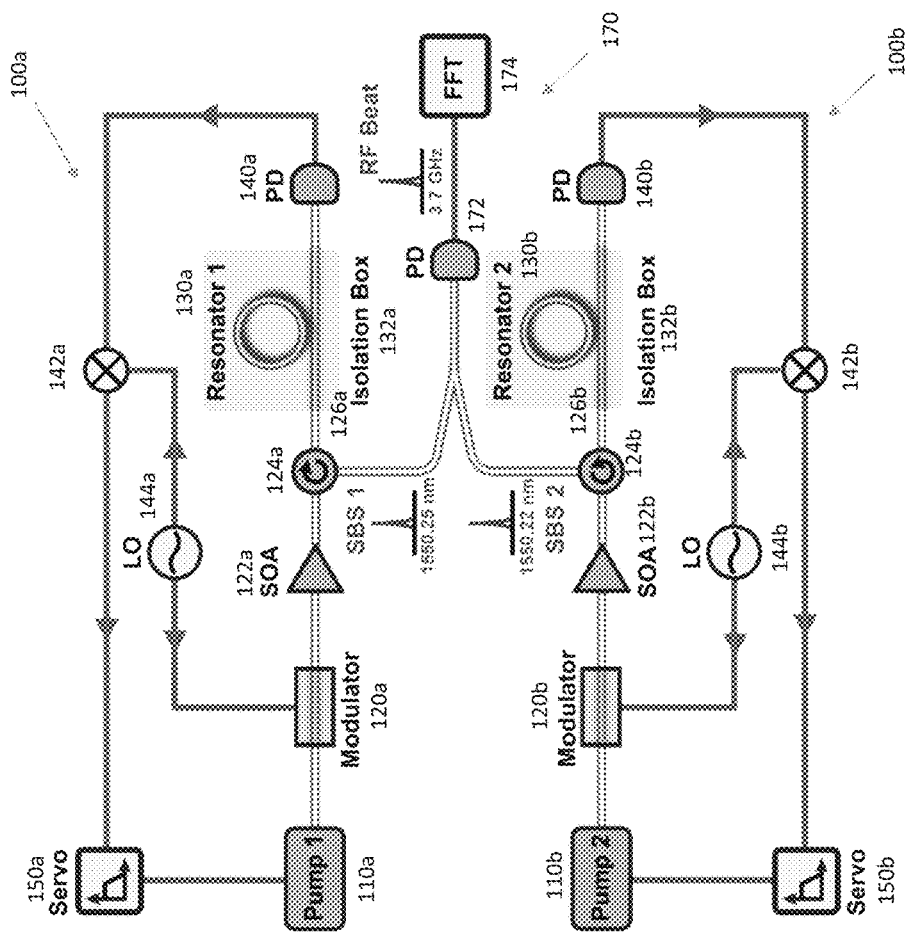
FIG. 1A

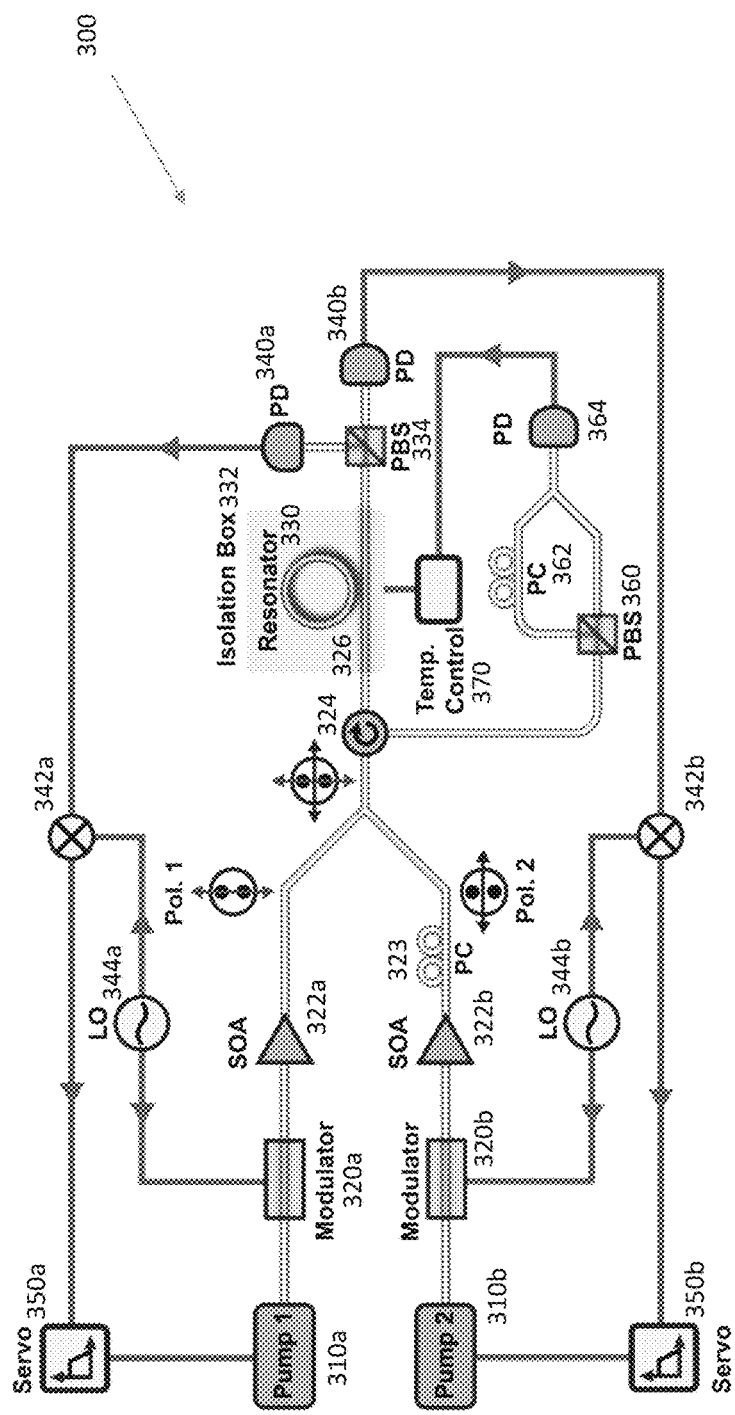
FIG. 3A
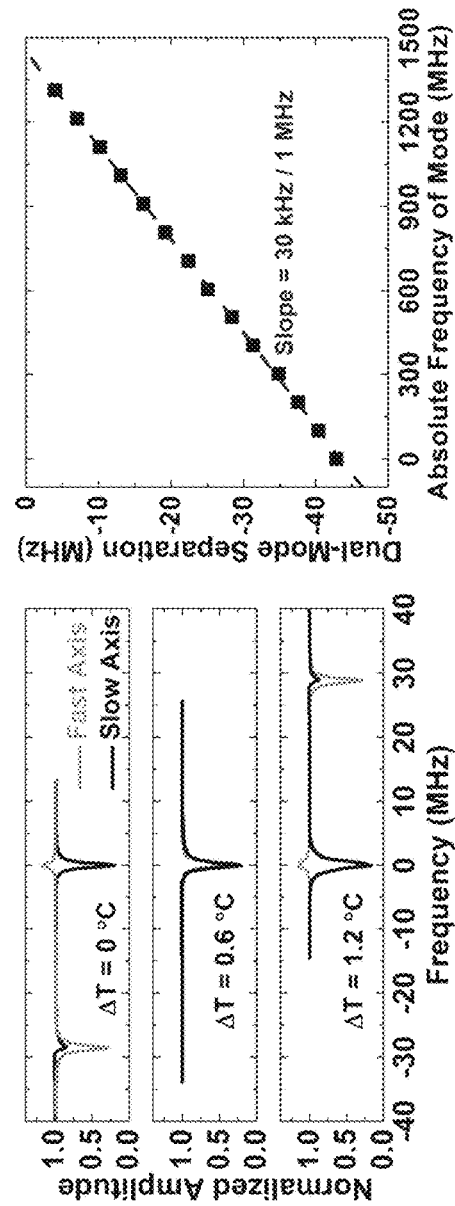
FIG. 3B
FIG. 3C

NARROW-LINEWIDTH MICROCAVITY BRILLOUIN LASER WITH SUPPRESSED TEMPERATURE FLUCTUATIONS

CROSS-REFERENCE TO RELATED APPLICATION(S)

This application claims the priority benefit, under 35 U.S.C. 119(e), of U.S. Application No. 62/665,605, filed on May 2, 2018, which is incorporated herein by reference in its entirety.

GOVERNMENT SUPPORT

This invention was made with Government support under Grant No. FA8702-15-D-0001 awarded by the U.S. Air Force. The Government has certain rights in the invention.

BACKGROUND

The ultra-low expansion (ULE) cavity-stabilized laser is presently the prominent technology for realizing laser linewidths of 1 Hz or below. This level of spectral purity is desired for a variety of applications spanning basic and applied science, such as trapped-ion quantum computing, precision spectroscopy, optical-atomic clocks, gravitational wave interferometry, optical frequency division, and frequency metrology. Currently, no other laser technology exists that provides both the ultra-narrow linewidth and long-term temperature stability of the ULE cavity-stabilized laser, as the propagation of light in any material other than vacuum adds both loss and sensitivity to temperature drift. Despite the advantages afforded by the ULE cavity, two significant drawbacks hold the ULE cavity-stabilized laser back from being a universal stable laser source. These drawbacks are the bulky size of the ULE cavity laser (~1 m$^3$) and the laser's susceptibility to vibration noise, both of which render the laser difficult to use outside of a laboratory environment.

SUMMARY

Optical gain provided by the stimulated Brillouin scattering (SBS) optical nonlinearity, when combined with a high quality factor (Q>10$^8$) resonator, presents a way to achieve a stable laser source that addresses the limitations of size and vibration sensitivity currently constraining the ULE-cavity design. The recent advances of optical frequency combs generated through four-wave mixing in a nonlinear microresonator and the development of narrow-linewidth lasers created through optical injection locking or through stimulated Brillouin and Raman scattering highlight the promise offered by high-Q resonators as precise frequency references. In particular, the potential of an SBS laser results from its ability to suppress the noise of the pump source. This linewidth reduction in conjunction with stabilizing the pump laser to the cavity resonance provides two stages of linewidth reduction that can bring the SBS linewidth below that of other laser technologies. Microresonators tend to be sensitive to temperature fluctuations, which causes the lasing frequency to fluctuate at time scales longer than the thermal response time of a microresonator used as a frequency reference.

Here, we disclose an SBS laser that reaches an integrated linewidth of 20 Hz by utilizing a high-Q resonator comprising 2 meters of polarization-maintaining (PM) fiber. (Other versions of this SBS laser have different resonators.) The PM fiber resonator's large mode volume critically suppresses thermo-refractive fluctuations and increases the laser's resistance in response to temperature change. The mode volume ranges greatly due to the wide range of possible transverse area values. The mode volume can be given as the product of cavity length, which usually ranges from 6 mm to 20 m, and mode area, which ranges from $\pi \times (1.5\ \mu m)^2 = 2.25\pi\ \mu m^2$ to $\pi \times (50\ \mu m)^2 = 2500\pi\ \mu m^2$.

Unlike other SBS sources, our SBS laser may use a low coupling ratio (e.g., about 1% to about 6%) into the resonator to achieve operation near critical coupling. (As understood by those of skill in the art, critical coupling occurs when the resonator loss rate equals the coupling of power out of the resonator. For more, see, e.g., A. Yariv, "Critical Coupling and Its Control in Optical Waveguide-Ring Resonator Systems," IEEE PTL 14: 483-485 (April 2002), which is incorporated herein by reference in its entirety.) This significantly increases the quality factor of the cavity and results in over two orders of magnitude reduction in noise for our SBS laser.

The frequency wander in lasers is an equally challenging problem separate from a laser's linewidth. Frequency wander results from the slow temperature drift of the laser's environment. In silica glass, for example, a 1° C. shift in temperature results in a 1.65 GHz shift of the lasing frequency. This frequency shift is eight orders of magnitude larger than the 20 Hz linewidth of our laser, which suggests that the laser's temperature should be stabilized to within about 10 nK to keep the SBS laser center frequency within one linewidth of its original position. The desired precision in temperature stabilization represents a challenge when the laser cavity includes a material other than vacuum. We address this issue by introducing a self-referenced scheme that senses the temperature drift of the cavity through the exceptional frequency precision afforded by our laser. Our temperature sensor combines the differential temperature sensitivity of the cavity's two orthogonal polarization modes with the exquisitely narrow SBS lasing line to detect minute temperature fluctuations as small as 85 nK. Increasing the resonator's quality factor could make it possible to detect even smaller temperature fluctuations (e.g., fluctuations as small as 10 nK).

An SBS laser system that address these challenges may include a pump laser, a modulator in optical communication with the pump laser, a waveguide in optical communication with the modulator, a resonator coupled to the waveguide, a photodetector in optical communication with the resonator (e.g., via a coupler), and locking circuitry operably coupled to the photodetector. In operation, the pump lasers emits a pump beam, which is modulated by the modulator with an error-correction signal so as to stabilize a linewidth of the SBS light. The waveguide guides the (modulated) pump beam from the modulator to the resonator, which has a thermal time constant of at least 1 second and generates the SBS light from a portion of the pump beam. The photodetector generates a photodetector signal in response to the SBS light, which can have a linewidth of about 100 Hz or less. And the locking circuitry generates the error-correction signal from the photodetector signal.

The resonator may have a loss rate that equals a rate at which power is coupled out of the resonator, a quality factor Q>10$^8$, and/or a thermal time constant of at least 10 seconds. The resonator can comprise at least 2 meters (e.g., up to about 20 meters) of optical fiber. It can also be on a substrate. The resonator can be critically coupled or undercoupled to the waveguide.

The laser may include an optical amplifier, in optical communication with the modulator and the resonator, to amplify the pump beam.

In some examples of this laser system, the pump is a first pump, the pump beam is a first pump beam in a first polarization state, the SBS light is first SBS light in the first polarization state, and the photodetector is a first photodetector. These examples may also include a second pump and a polarization controller in optical communication with the resonator, a second photodetector in optical communication with the polarization controller, temperature-control circuitry operably coupled to the second photodetector, and a heater operably coupled to the temperature-control circuitry and in thermal communication with the resonator. In operation, the second pump generates a second pump beam in a second polarization state orthogonal to the first polarization state. The resonator generates second SBS light in the second polarization state from a portion of the second pump beam. (The portion of the first pump beam is coupled to a first mode of the resonator and the portion of the second pump beam is coupled to a second mode of the resonator.) The polarization controller transforms the second SBS light from the second polarization state to the first polarization state. The second photodetector detects interference between the first SBS light and the second SBS light. The temperature-control circuitry generates a temperature-control signal from the interference between the first SBS light and the second SBS light. And the heater heats the resonator in response to the temperature-control circuitry. In some case, the laser system may also include a frequency shifter, in optical communication with the resonator, to frequency-shift the first portion with respect to the second portion. The first pump can emit the first pump beam at a first wavelength and the second pump can emit the second pump beam at a second wavelength different than the first wavelength.

A inventive method of emitting SBS includes coupling a portion (e.g., about 1% to about 6%) of a pump beam from a waveguide into a resonator with a thermal time constant of at least 1 seconds. The resonator generates the SBS light from the portion of the pump beam, and the SBS light is coupled out of the resonator. A detector senses an amplitude of a portion of the SBS light; this amplitude is used to generate an error-correction signal, which is used to modulate a phase of the pump beam, thereby reducing a linewidth of the SBS light (e.g., to about 100 Hz or less).

In some cases, the pump beam is a first pump beam in a first polarization state and the SBS light is first SBS light. In these cases, the method may include coupling a portion of a second pump in a second polarization state orthogonal to the first polarization state into the resonator. The resonator generates second SBS light in the second polarization state from the portion of the second pump beam. This second SBS light is coupled out of the resonator, transformed from the second polarization state to the first polarization state, and interfered with the first SBS light. The resonator is then heated in response to the interference between the first SBS light and the second SBS light.

Another example SBS laser system includes a pump laser, optical filter, resonator (e.g., a spiral waveguide with a length of about 1 meter), modulator, and photodetector all integrated on a substrate. In operation, the pump laser emits a pump beam at a pump wavelength. The optical filter, which has a passband containing the pump wavelength (e.g., about 1550 nm), transmits the pump beam and prevents light at wavelengths other than the pump wavelength from propagating into the pump laser. The resonator, which may have a thermal time constant of at least 1 seconds, generates the SBS light from a portion of the pump beam. The modulator modulates an optical path length of the resonator with an error-correction signal so as to stabilize a linewidth of the SBS light. The photodetector generates a photodetector signal in response to the SBS light.

Circuitry operably coupled to the photodetector generates the error-correction signal from the photodetector signal. The circuitry can also modulate the pump wavelength and/or the amplitude of the pump beam. And the circuitry can tune the passband of the optical filter.

All combinations of the foregoing concepts and additional concepts discussed in greater detail below (provided such concepts are not mutually inconsistent) are part of the inventive subject matter disclosed herein. In particular, all combinations of claimed subject matter appearing at the end of this disclosure are part of the inventive subject matter disclosed herein. The terminology used herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 1A shows a pair of identical SBS lasers and laser characterization systems. Each SBS laser comprises a pump laser, a phase modulator, a semiconductor optical amplifier (SOA), a fiber resonator, and a photodiode (PD). The pump is locked to a cavity resonance through demodulation via a local oscillator (LO).

FIG. 1B shows laser scans over the mode profile of the resonator in FIG. 1A for varying coupling ratios. Critical coupling occurs at 1.3% coupling corresponding to a resonance width of 420 kHz.

FIG. 1C is a plot of SBS laser output power as a function of the supplied input optical pump power for the lasers in FIG. 1A. The threshold power is 4.6 mW, and the slope efficiency is 79% until the second SBS Stokes oscillation occurs at 20 mW input.

FIG. 3A shows SBS laser dual-mode thermometry with a dual-mode SBS laser comprising two pump lasers that are phase-modulated, amplified, and locked to two orthogonally polarized modes of a single resonator. One of the pump lasers is rotated using a polarization controller (PC) to the orthogonal polarization, and the two polarizations are separated using a polarization beam splitter (PBS).

FIG. 3B shows a measurement of the shift in orthogonal polarization modes with temperature in the dual-mode SBS laser of FIG. 3B. A 1.2° C. temperature change corresponds to a change in mode separation of approximately 58 MHz.

FIG. 3C illustrates efficiency of the dual-mode separation in response to temperature relative to the response of a single resonator mode in the dual-mode SBS laser of FIG. 3B. The dual-mode separation changes by 30 kHz for every 1 MHz shift in the cavity resonance.

Figures 4A, 4B:
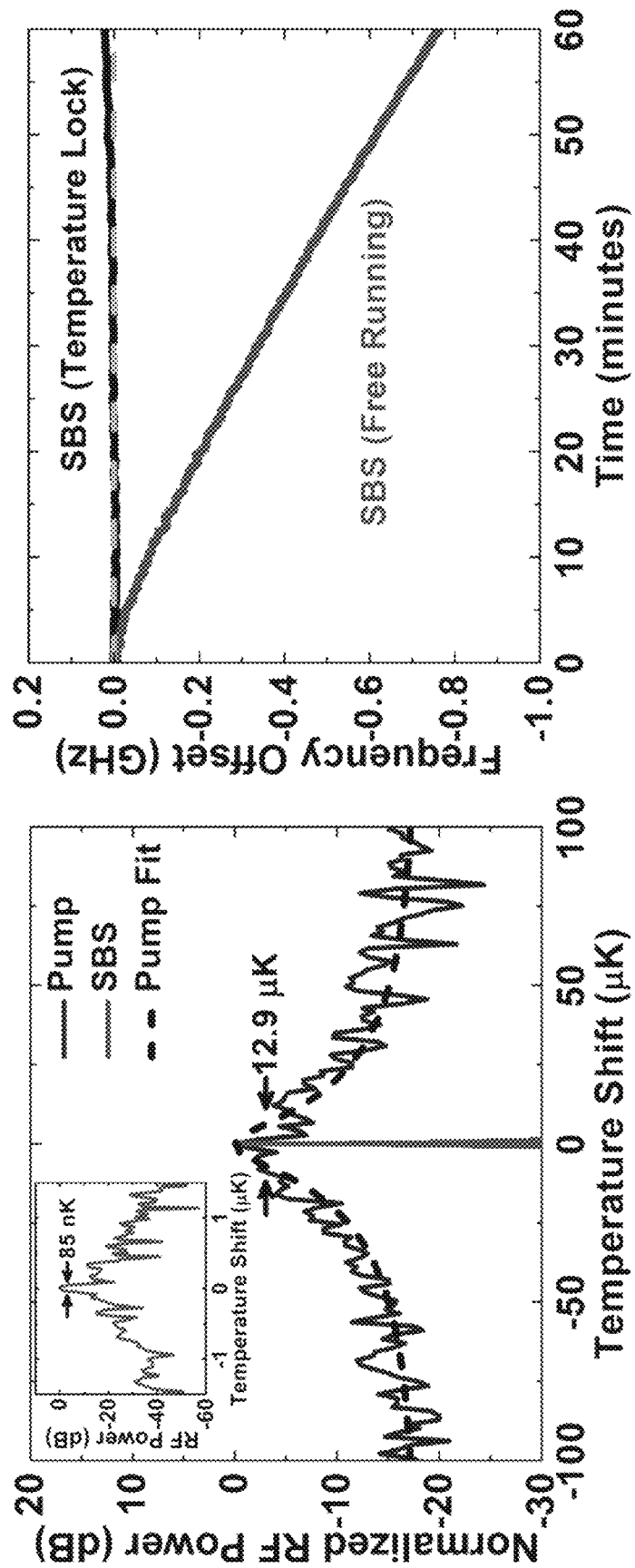

FIG. 4A is a plot of the sensitivity of the locked pump (upper trace) and SBS laser of FIG. 3A (narrow peak) for the measurement of temperature. A fit to the pump laser (dashed line) indicates a resolution of 12.9 while the SBS laser line is a single narrow peak on the same scale. The inset shows a zoomed in plot of the SBS line indicating a temperature resolution of 85 nK.

FIG. 4B is a plot of SBS laser frequency drift for free-running (lower trace) and temperature stabilized (upper trace) cases. When locked, the SBS drift is nearly unnoticeable compared to the ideal zero drift case (dashed line).

Figure 5:
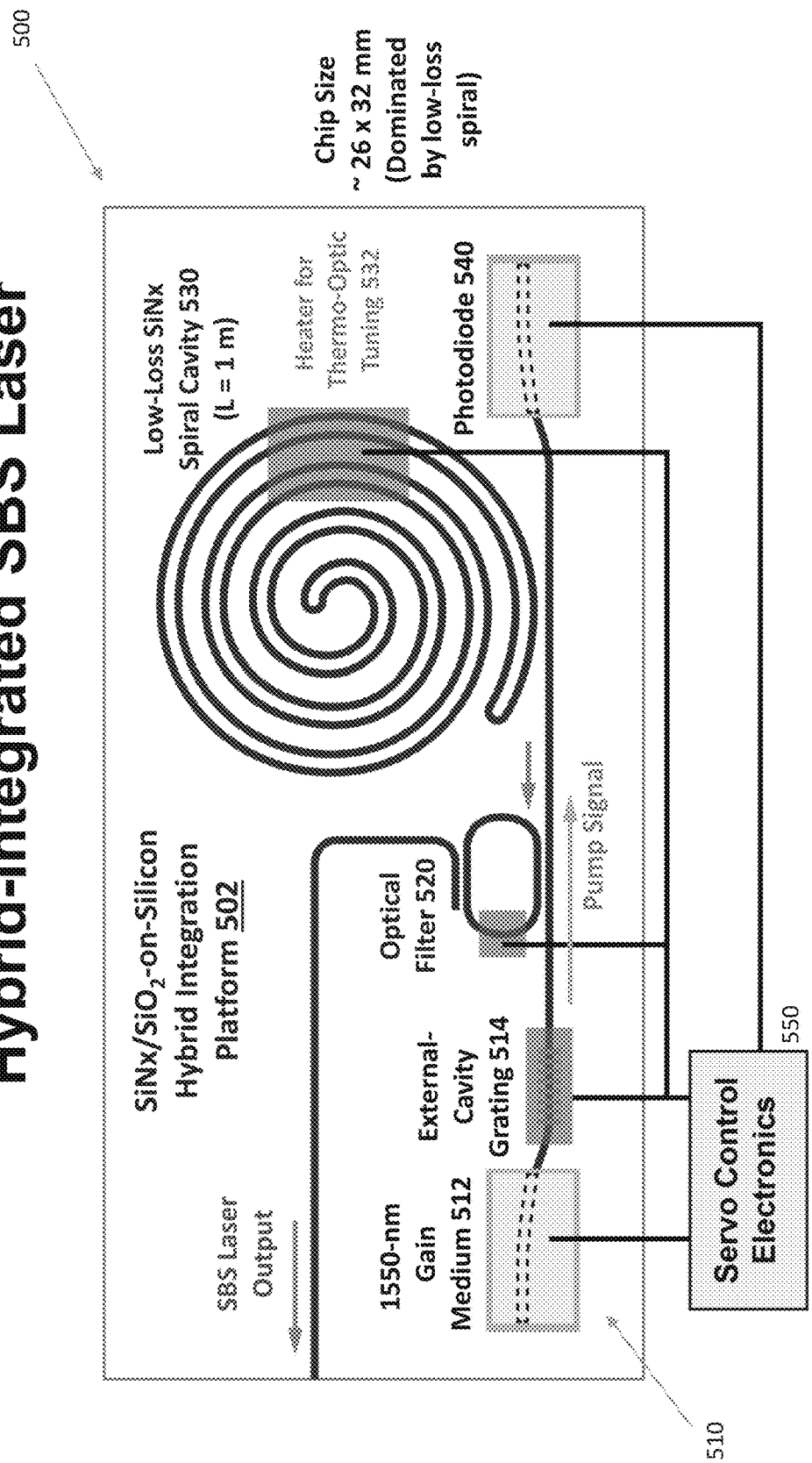

FIG. 5 shows a hybrid integrated SBS laser with an on-chip spiral cavity.

Figure 6:
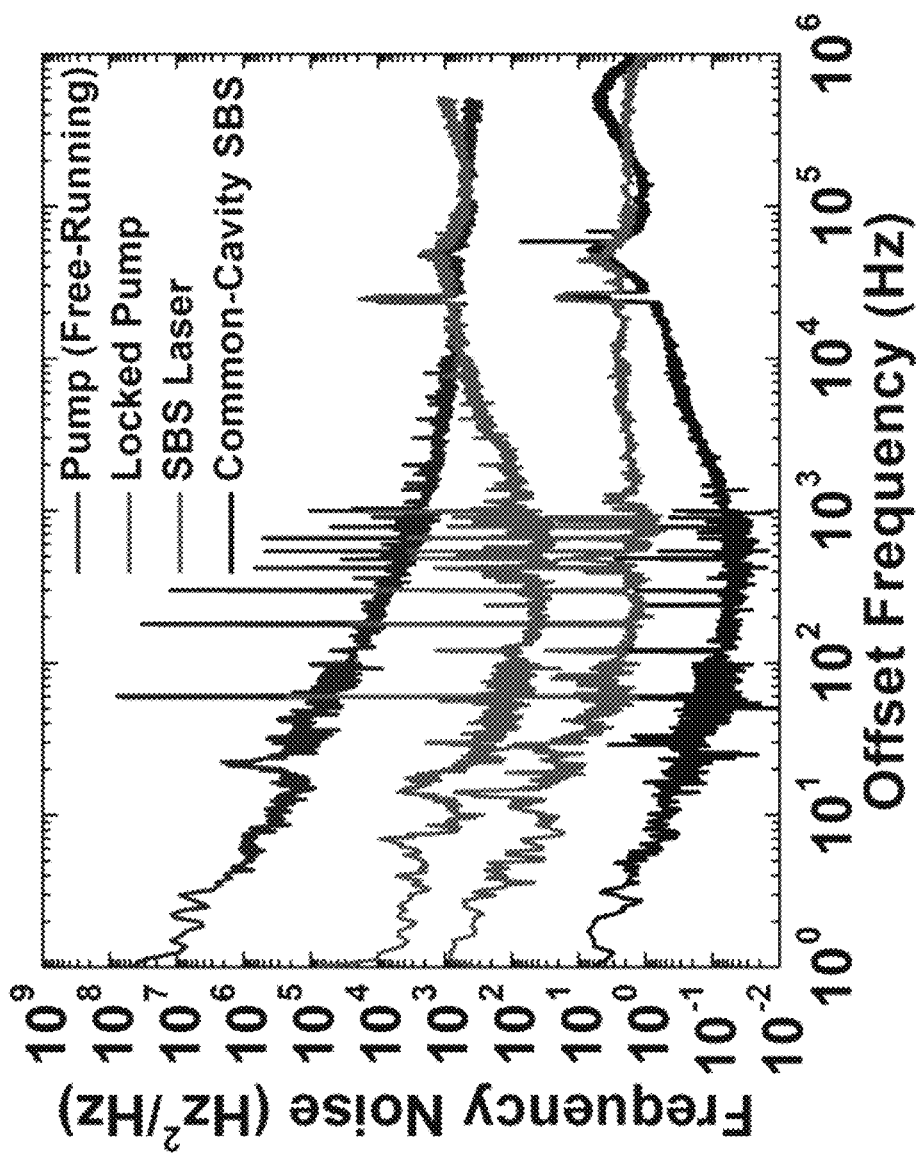

FIG. 6 is a plot of measurements of frequency noise corresponding to the pump laser (top trace), a Pound-Drever-Hall (PDH)-locked pump laser (upper middle trace), the SBS laser of FIG. 1A (lower middle trace), and SBS temperature sensor of FIG. 3A (bottom trace). The SBS laser receives an additional factor of 30 dB noise suppression from the locked pump laser, but this suppression diminishes below 30 kHz offset frequency. By measuring the noise using two orthogonal polarization SBS lasers generated from one common resonator, the common-mode noise is reduced, and the SBS noise reaches a new lower floor (bottom trace). This floor is now 30 dB reduced from the locked pump case at all offset frequencies.

DETAILED DESCRIPTION

Increasing the mode volume of a high-Q resonator can increase a resonator's resilience to temperature fluctuations. This technique combined with the ability to generate lasing from the stimulated Brillouin scattering (SBS) nonlinearity of an otherwise passive resonator allows for the realization of an SBS laser that reaches a linewidth of 20 Hz. Owing to its temperature stability, the SBS laser noise at low Fourier frequencies is orders of magnitude lower than that of state-of-the-art microresonator lasers. The exquisitely narrow SBS line can be used as an ultra-precise sensor to detect and correct for minute temperature shifts as small as 85 nK, which is over two orders of magnitude smaller than the sensitivity with an otherwise identical dual-mode sensor employing a 270 Hz linewidth pump laser. Correcting such small shifts in the resonator's temperature reduces or prevents the long-term drift of the resonator's frequency.

These advances all serve to highlight the promise of the SBS laser as a precision laser source capable of replacing the ULE cavity laser for applications that benefit from an ultra-narrow-linewidth, portable laser. Examples of the SBS laser could achieve even narrower linewidths of 1 Hz and below by overcoming limitations imposed by common-mode technical noise. SBS laser systems can be made with discrete fiber-optic components and high-Q, on-chip microresonators integrated into a single monolithic package with other components.

SBS Laser Configuration and Characteristics

A narrow-linewidth stimulated Brillouin scattering (SBS) laser generates SBS laser light by sending the output of an integrated planar external-cavity laser pump through a high-Q resonator. The resonator can include a tunable coupler with two of its ends spliced together to form a fiber ring that is two meters in length. The corresponding cavity free spectral range is 100 MHz, which for a Brillouin shift of 10.9 GHz means that 108 modes are skipped between the pump and SBS lasing resonance. However, since the Brillouin gain bandwidth is about 50 MHz, only a single longitudinal mode reaches oscillation despite the long cavity length.

FIG. 1A shows a pair of independent SBS lasers 100a and 100b (collectively, SBS lasers 100) and a frequency-noise characterization system 170 that measures the frequency-noise from a microwave beat signal between the outputs of the SBS lasers 100. Each SBS laser 100a (100b) includes a pump laser 110a (110b) whose output, also called the pump beam, is coupled to a phase modulator 120a (120b), which is driven by a local oscillator signal from a local oscillator (LO) 144a (144b) and is coupled in turn to a semiconductor optical amplifier (SOA) 122a (122b). The SOA boosts the output power of the pump beam up to about 15 mW.

The output of the SOA 122a (122b) is coupled to a first port of a three-port circulator 124a (124b). The second port of the three-port circulator 124a (124b) is coupled to the input of a waveguide 126a (126b) that is in turn evanescently coupled to an optical resonator 130a (130b) in an isolation box 132a (132b). This resonator 130a (130b) has a thermal time constant of at least 1 second (e.g., 1 second, 2 seconds, 5 seconds, 10 seconds, or more) and can include a length of optical fiber (e.g., 2, 5, 10, 20, or more meters of optical fiber). The isolation box 132a (132b) shields the resonator 130a (130b) from vibrations, temperature fluctuations, and other thermal perturbations.

Typically, about 1% to about 6% of the pump beam is coupled from the waveguide 126a (126b) into the optical resonator 130a (130b). This may be close to or just under critical coupling, which occurs when the amount of pump light coupled into the optical resonator 130a (130b) equals the amount of pump light that is evanescently coupled out of the optical resonator 130a (130b) into the waveguide 126a (126b). Slight undercoupling (i.e., coupling just under the threshold for critical coupling) may lead to the lowest laser linewidth.

The portion of the pump beam that bypasses the resonator 130a (130b) is collected on a photodetector 140a (140b) and used in a Pound-Drever-Hall (PDH) scheme to stabilize the wavelength of the pump beam to the cavity resonance. More specifically, the photodetector 140a (140b) transduces the detected pump light into an electrical signal (e.g., a photocurrent). It may have a bandwidth of about 150 MHz to detect 10 MHz to 20 MHz modulation imparted by the phase modulator 120a (120b).

A mixer 142a (142b) coupled to the photodetector 140a (140b) mixes this electrical signal with the local oscillator signal from LO 144a (144b), producing an intermediate frequency (IF) output that drives servo circuitry 150a (150b) for locking the pump laser 110a (110b) to the resonator 130a (130b). Locking the pump laser 110a (110b) to the resonator 130a (130b) reduces the linewidth of the SBS laser's SBS output.

As the pump beam propagates through the resonator 130a (130b), it generates SBS light that is evanescently coupled out of the resonator 130a (130b) into the waveguide 126a (126b). The wavelength of the SBS light is set by the pump wavelength and is typically selected so that it is attenuated as little as possible by the optical fiber. It can range, for example, from 674 nm (or lower) to 2039 nm. The SBS light propagates through the resonator 130a (130b) and the waveguide 126a (126b) in the opposite direction as the pump beam. It goes back through the second port of the circulator 124a (124b) and out through the third port of the circulator 124a (124b), which serves as the laser's output port. Thanks to the wavelength stabilization provided by the resonator 130a (130b), the linewidth could reach the fundamental limit of 10 mHz.

In this case, the SBS outputs of the SBS lasers 100 are set by the tuning the pump lasers 110 and are at slightly different wavelengths—the SBS output of the first SBS laser 100a is at 1550.25 nm and the SBS output of the second SBS laser 100b is at 1550.22 nm. These SBS outputs are combined and interfere with each other on a photodetector 172 to produce a radio-frequency (RF) beat note at 3.7 GHz. A processor 174 coupled to the photodetector 172 generates a fast Fourier transform (FFT) of the RF beat note for use in characterizing the relative stability of SBS lasers 100.

FIG. 1B depicts resonator mode scans corresponding to three coupling ratios for coupling the pump beam into the resonator 130a (130b) in the SBS lasers 100 shown in FIG. 1A. Critical coupling occurs at a coupling ratio of 1.3% with an associated resonance linewidth of 420 kHz, which implies that the fiber resonator 130a (130b) reaches an intrinsic Q of 920 million. The output power of the SBS laser can be increased by operating at a coupling ratio of 5.6%, where the loaded cavity Q reduces to 170 million but permits more power to be coupled out of the cavity.

FIG. 1C shows the SBS output power as a function of the pump power input to the resonator coupler. The SBS laser threshold power is 4.6 mW and the slope efficiency is 79% but rolls off at higher pump power (e.g., at about 20 mW) when a second SBS line begins to reach oscillation threshold. For the laser noise measurements described below, the SBS laser operates with 11 mW pump power and generates 5 mW SBS output power, which corresponds to a very high optical-to-optical conversion efficiency of 45%.

The coupling ratios used here represent a marked decrease compared to the approximately 50% coupling previously used for fiber SBS lasers. At 50% coupling, the cavity Q becomes artificially degraded (e.g., by a factor of ten or more) compared to operation at critical coupling and the vast majority of input pump power bypasses the resonator and becomes unusable for SBS generation. Often, the resonator length is increased by over an order of magnitude to compensate for the degradation in Q, which in turn makes the system less stable due to multiple oscillating modes in the resonator and increased sensitivity of the resonator to environmental perturbations.

One advantage of using a large mode-volume resonator is the long thermal time constant (e.g., 1 second, 2 seconds, 3 seconds, 4 seconds, 5 seconds, 10 seconds, or more) for the system to settle into thermal equilibrium. The thermal time constant depends on the resonator's mode volume, material(s), and construction and is a measure of the resonator's insensitivity to thermal fluctuations. It can be determined by measuring the roll off in frequency response of the SBS laser as the system temperature is modulated. The reciprocal of the roll-off frequency is the thermal time constant. The insensitivity to thermal fluctuation represented by the thermal time constant isolates the SBS laser from disturbances in the outside environment and prevents the internal coupling of intensity noise to changes in the resonator temperature. Previously, these thermal fluctuations were identified as the dominant limitation in SBS laser performance, which degraded the SBS noise by as much as 4 orders of magnitude at low frequencies.

Figure 2B:
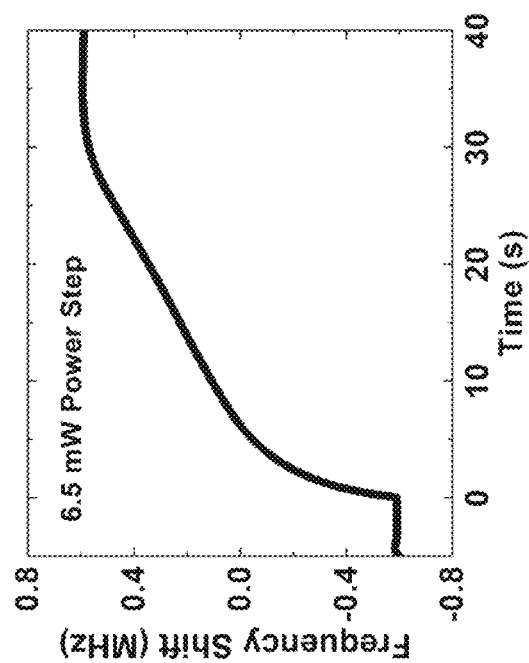
FIG. 2B shows a time domain response of the SBS laser frequency for a 6.5 mW step increase in input pump power. The measured rise time is 24.6 seconds.
Figure 2A:
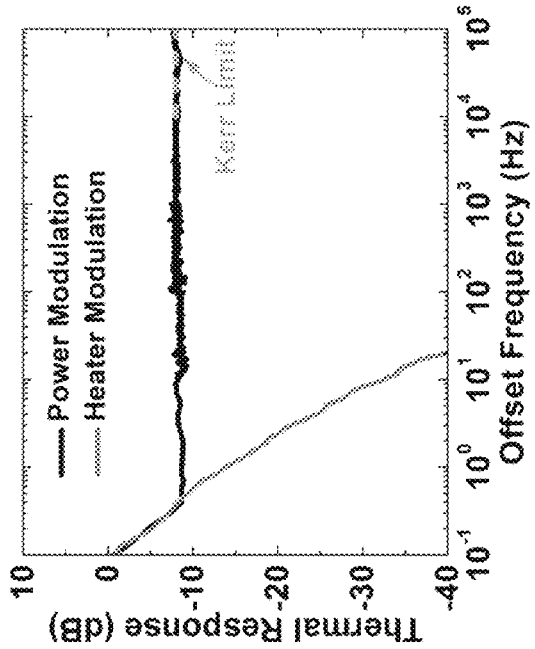
FIG. 2A shows SBS laser thermal response corresponding to the cases of input optical power modulation and heater modulation. Both cases show a continuous roll off in response starting at 100 mHz, but for optical power modulation, the Kerr limit is reached after 0.4 Hz.

FIG. 2A shows the measured thermal response of the frequency of the SBS lasers 100 in FIG. 1A when the resonator temperature is changed by both varying the input pump power and varying directly the heat applied to a section of the resonator. For the case of direct heater modulation, the response of the SBS laser continues to roll off even for frequencies down to 100 mHz, signifying a thermal time constant of at least 1 second. When the optical power is instead modulated to indirectly change the resonator temperature, the same roll off occurs but comes to a halt beyond 0.4 Hz. At this point, the resonator frequency shift reaches the Kerr nonlinearity limit where the material index change becomes dominated by a shift in optical intensity rather than a shift in temperature.

Since the roll off is still present at the lowest frequency of 100 mHz, the thermal response was instead determined in the time domain by measuring the time it takes for the SBS laser frequency to respond to an input optical power shift of 6.5 mW (FIG. 2B). FIG. 2B shows a 10% to 90% rise time of 24.6 seconds, which corresponds to a thermal time constant of 11.2 seconds, which we use to normalize the 3 dB point of the frequency response in FIG. 2A. The benefit of the long time response on the resonator's temperature stability is clearly observed in the resonator mode scan of FIG. 2C.

Figure 2C:
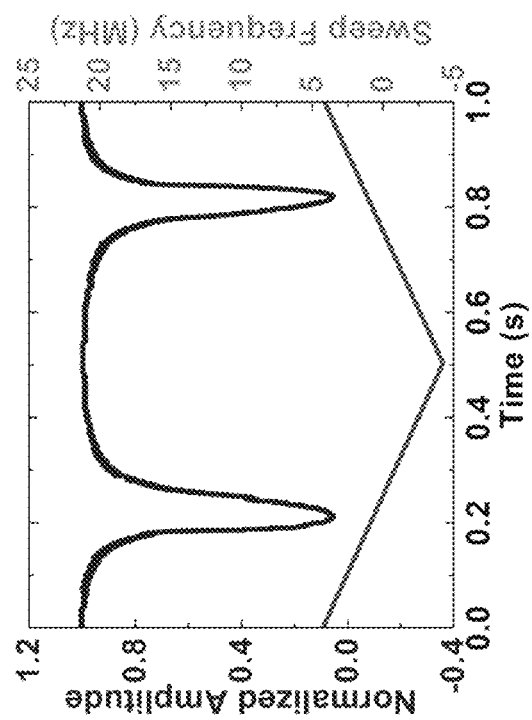
FIG. 2C shows a pump laser sweep over a resonance mode showing no visible effects of mode asymmetry from thermal bistability. The scan speed is intentionally made slow to allow the pump to spend 70 ms within the cavity linewidth.

In FIG. 2C, an 8.3-MHz scan of the input pump frequency from high to low and vice versa occurs in 1 second, which equates to a time of 70 milliseconds spent within the resonance linewidth. Because the time on resonance is much lower than the cavity's thermal response time, no effects of thermal bistability are observed, and the modes from the forward and backward scans are seen to be symmetric. The excellent thermal stability of a resonator with such a long thermal time constant makes the resonator an excellent choice for use as a narrow-linewidth SBS laser source. In contrast, the modes of typical microresonator systems exhibit significant asymmetry due to the thermal broadening that occurs when the resonance responds to the frequency shifts of the pump laser. For these faster-responding microresonator systems, the pump frequency noise is transferred over to the cavity resonance, degrading stability.

SBS Laser Temperature Sensing and Stabilization

In addition to the SBS laser's short-term linewidth performance, the long-term frequency drift of the laser is a separate issue. For laser systems where the optical intensity resides in any material other than vacuum, a small temperature change results in a massive change in the cavity's resonance frequency (e.g., 1° C. induces a frequency shift of about 1.5 GHz in the resonance frequency of a silica glass cavity). In order to both detect and correct for this frequency drift, we use a dual-polarization temperature sensing technique with the exquisitely narrow linewidth of the SBS laser to measure very small temperature changes of the resonator.

FIG. 3A shows an SBS temperature sensor 300 with two independent pump lasers 310a and 310b whose outputs (pump beams) are phase modulated with LO signals using phase modulators 320a and 320b, respectively, and amplified with SOAs 322a and 322b, respectively, before being launched onto a polarization-maintaining (PM) common path (e.g., a single PM fiber). The pump beams are vertically polarized, so one pump beam is rotated to the orthogonal (horizontal) polarization with a polarization controller (PC) 323 before being launched onto the common path. (Alternatively, the pump lasers 310a and 310b may emit orthogonally polarized pump beams.)

The co-propagating, orthogonally polarized pump beams are sent through a circulator 324 into a PM fiber 326 that is evanescently coupled to a single PM fiber resonator 430. As explained above, about 1% to about 6% of each pump beam is coupled from the PM fiber 326 to the PM fiber resonator 430, which is in an isolation box 432 that dampens vibrations and insulates the PM fiber resonator 430 from temperature swings. The PM fiber resonator 430 may have a thermal time constant of at least 1 second (e.g., 1 second, 2 seconds, 5 seconds, 10 seconds, or more) and can be critically coupled or undercoupled (coupled slightly below the critical coupling threshold) to the PM fiber 326. Each pump beam probes a separate mode of the resonator 430, with the modes corresponding to the two orthogonal polarizations. These modes are called the fast-axis and slow-axis modes in reference to the fast and slow axes of the PM fiber that makes up the PM fiber resonator 430.

The pump beams are locked on resonance using the PDH technique. In this case, a polarizing beam splitter (PBS) 434 sends the portions of the pump beams that aren't coupled into the resonator 430 to separate photodetectors 340a and 340b. Each photodetector 340a, 340b generates a separate electrical signal; these electrical signals are mixed with LO signals from LOs 344a, 344b by mixers 342a and 342b, and the resulting IF signals drive servo electronics 350a, 350b, which in turn drive the pump lasers 310a, 310b. Because the pump beams lock to different cavity modes, the pump lasers 310a, 310b are stabilized at slightly different frequencies.

The pump beams propagating through the resonator 430 generate orthogonally polarized, counter-propagate SBS light. A portion of this SBS light couples out of the resonator 430 to the PM fiber 326, which guides it to the circulator 324. The two orthogonally polarized SBS laser outputs traverse the circulator 324 and are separated using a PBS 360. One pump laser beam is rotated with another polarization controller 362 to once again match the polarization of the other pump laser beam, and the SBS outputs are combined on a photodetector 364 to produce a microwave beat that drives a temperature controller 370. (The output of the SBS laser can be tapped off just before this photodetector 364.)

A change in frequency of the microwave beat directly corresponds to a change in the temperature seen by the optical mode(s) of the resonator. As the temperature changes and the microwave beat shifts in frequency, the temperature controller 370 heats and/or cools the resonator 430 to compensate. The temperature controller 370 detects a frequency shift of the microwave beat as measured on a frequency counter. The temperature controller 370 uses this measurement as input to a software proportional-integral-derivative (PID) feedback loop, which drives the voltage sent to a resistive heater (not shown) for control of the resonator's temperature. Setting the loop time constant to 0.5 seconds prevents oscillation instability.

FIG. 3B illustrates measured shifts in frequency of the microwave beat with temperature. When the resonator is at room temperature (AT=0° C.; top plot), the resonator modes aligned to the two orthogonal fiber polarizations were 29 MHz apart with the fast axis mode trailing the slow axis mode. When a 0.6° C. temperature shift was applied (middle plot), the relative position of the two modes changed such that the two modes were coincident in frequency. Finally, with a further total applied temperature shift of 1.2° C. (bottom plot), the fast axis mode moved to a position 29 MHz ahead of the slow axis mode.

By locking the two orthogonal polarization pumps each to a separate mode, the difference in frequency of the pump lasers directly reflects a shift in the resonator's temperature. Moreover, as the SBS output is generated at a frequency offset from the pump, the information of the temperature shift is also imprinted on the SBS microwave beat. FIG. 3C shows the efficiency of using this dual-mode technique for temperature sensing where for every 1 MHz change in the resonator mode's absolute frequency, the relative separation of the resonator modes changes by 30 kHz.

The resolution of the dual-mode temperature sensor is ultimately set by the linewidth of the lasers used for interrogating the mode separation. Without being bound by any particular theory, this limitation arises because the frequency noise on the lasers transfers over to the frequency of the resulting microwave beat and hence gives the appearance of a change in temperature when no such change exists. When the microwave beat is then used as the feedback signal to servo the resonator's temperature, this noise becomes imprinted on the resonator as a correction to a temperature change that never occurred. For these reasons, we define the sensitivity of our dual-mode Brillouin temperature sensor 300 in FIG. 3A using the SBS laser's linewidth rather than by using the noise of the already-stabilized in loop microwave beat as is traditionally done in dual-mode sensor demonstrations. Owing to the SBS laser's narrow linewidth that becomes even lower here (linewidth=2.6 Hz) with the common-mode noise suppression of FIG. 6, the Brillouin sensor (dn/dT=11.6×10$^{-6}$) can detect temperature changes with 85 nK resolution as seen in FIG. 4A (inset and steep, narrow trace in main plot). In contrast, measurements using the locked pump laser (linewidth=270 Hz) in place of the SBS, which corresponds to the traditional dual-mode sensor configuration, yielded a temperature sensitivity of 12.9 μK (broad, noisy trace in main plot).

The SBS laser's exceptional temperature resolution offers a way to correct the laser's own temperature variations over time. Given a detection sensitivity of 85 nK and the ability to perform ideal temperature servoing, the frequency drift of the SBS laser is expected to reside within a bound of 130 Hz. In contrast to other dual-mode lasers, which stabilize the resonator temperature through varying optical intensity, we use direct resistive heating to induce temperature change. As seen in FIG. 2A, this distinction prevents a substantial Kerr shift from building up as the injected optical power changes, which would lead to a residual drift in the laser's frequency even as the temperature appears to be stabilized.

FIG. 4B shows the frequency excursion corresponding to one of the two SBS polarizations measured with and without temperature stabilization over a duration of an hour. Since both pump lasers (pump lasers 310a and 310b in FIG. 3A) are used to measure the temperature of a single cavity, the absolute frequency of the SBS laser was measured using a wavelength meter with a spectral resolution of a few MHz. To ensure the SBS laser frequency drift was large enough to be resolved, the temperature of the room was intentionally ramped about 100 times faster than typical laboratory conditions. From FIG. 4B, the free-running SBS (lower trace) shifted by 760 MHz over an hour, while the temperature-stabilized SBS (upper trace) exhibited no visible drift compared to the dashed-line guide until the last 15 minutes of measurement. The stabilized SBS frequency was blue-shifted in frequency by 22 MHz when the temperature feedback mechanism exited its intended range of operation. Taking a worst-case drift of 22 MHz per hour, the SBS laser frequency shifted by 6.1 kHz per second, which equates to about 60 Hz per second after accounting for the intentional ~100× faster applied temperature ramp.

Hybrid-Integrated SBS Laser

FIG. 5 shows a hybrid-integrated SBS laser 500 that emits a highly stabilized, narrow-linewidth SBS output. The laser 500 includes an external-cavity pump laser 510, shown in FIG. 5 as including a 1550 nm gain medium 512 coupled to an external-cavity grating 514, that emits a PDH-stabilized pump beam at a wavelength of 1550 nm. A tunable optical filter 520 coupled to the output of the grating 514 passes the stabilized pump beam and rejects light at other wavelengths, isolating the pump laser from back reflections, etc. It also separates the SBS output from the pump beam as described below. A portion of the filtered pump beam is evanescently coupled into a low-loss, $SiN_x$ resonator formed of a spiral cavity 630 with a length of millimeters to meters (e.g., about 1 meter), a quality factor of about $10^8$, and a mode volume of about $2.8 \times 10^{-11}$ $m^{-3}$ for a length of about 1 meter. (Other cavity shapes and types are also possible, including loops, s-curves, and Fabry-Perot resonators.) The portion of the filtered pump beam propagating through the spiral cavity 530 generates an SBS emission, which couples out of the spiral cavity 530, through the optical filter 520, to the SBS laser output.

A photodiode 540 detects the rest of the filtered pump beam. Off-chip servo control electronics 550 use the photocurrent from the photodiode 540 to lock the frequency of the pump laser 510 to a resonance of the spiral cavity 530. The servo control electronics 550 control the pump laser frequency by heating the gain medium 512 and tuning the grating 514. The servo control electronics 550 also tune the passband of the optical filter 520 and heat the cavity with a resistive heater 532 to further stabilize the frequency of the SBS laser output. The amount of tuning applied by the servo electronics 550 to optical filter 520 depends in part on the fabrication uncertainties of the optical filer filter 520 and could be on the order of Gigahertz.

More specifically, the photodiode signal is a microwave beat note (e.g., at around 20 MHz). Changes in the frequency of this microwave beat note directly correspond to changes in temperature. A frequency counter, frequency-to-voltage converter, or other suitable component in the servo control electronics 550 transforms these frequency changes into a voltage signal. A proportional-integral-derivative (PID) loop implemented by the servo electronics 550 uses this voltage signal is sent to a PID loop to stabilize the frequency of the microwave beat note (and thus temperature of the system).

The laser's active and passive optical components are fabricated in a $SiN_x/SiO_2$-on-silicon hybrid integration platform 502, with waveguides, gratings, and other structures formed of $SiN_x$ and $SiO_2$ deposited and patterned on a silicon substrate. The laser gain medium 512 and photodiode 540 can be made of other materials, such as InP or In GaAs, respectively, and bonded to the substrate. Likewise, the heater 532 may include resistive layers that are formed on or under the cavity 530. Other materials would work as well, depending on the laser's operating wavelength. The entire platform (chip) 502 is about 26 mm by 32 mm, with most of the area taken up by the low-loss spiral cavity 530.

SBS Laser Frequency Noise Measurements

FIG. 6 shows the frequency noise measured for a free-running pump laser (top trace), the PDH-locked pump laser (upper middle trace), the SBS laser (lower middle trace) in FIG. 1A, and the common-cavity configuration (bottom trace) in FIG. 3A. We measured the frequency noise of the pump and PDH-locked pump lasers by using an unbalanced delay-line Mach-Zehnder with 250 meters of additional delay placed in one modulator arm. The interferometer converted frequency noise to voltage noise, which was measured on an electrical spectrum analyzer. The SBS laser's frequency noise was measured by direct heterodyning two independent SBS lasers as shown in FIG. 1A and sending the resulting microwave beat through a microwave frequency-to-voltage converter and into an electrical spectrum analyzer. For the common-cavity SBS configuration in FIG. 3A, the noise was below that of the frequency-to-voltage converter. We multiplied the microwave beat of the common-cavity SBS by a factor of 5 in order to increase the frequency noise above the floor of the converter.

In free-running operation, the pump laser exhibited an integrated linewidth of 3 kHz and reaches a frequency noise level of $3 \times 10^5$ $Hz^2/Hz$ at 10 Hz offset frequency. By locking the pump laser to the cavity resonance, the noise within the locking bandwidth is improved to a value of 830 $Hz^2/Hz$ at 10 Hz offset, which yields an integrated linewidth of 270 Hz. Finally, by achieving SBS lasing in the resonator, the noise receives one more factor of improvement due to the SBS suppression of the pump noise. This noise suppression occurs in addition to the improvement gained from pump locking and enables the SBS frequency noise to reach 30 $Hz^2/Hz$ at 10 Hz offset frequency, which corresponds to an integrated linewidth of 20 Hz.

For the SBS laser in FIG. 1A, the calculated value of noise suppression is 30 dB as is observed when comparing the locked pump noise to the SBS noise above 30 kHz offset. However, below 30 kHz, this suppression decreases as the SBS noise flattens and increases again below 100 Hz offset. The 2 $Hz^2/Hz$ white noise limit of the SBS noise is a result of intensity noise in the SBS laser coupling to frequency noise through the nonlinear Kerr effect.

To determine the ideal performance of our SBS laser, we bypass this limit by comparing two orthogonal polarization SBS lasers generated from a single common cavity as shown in FIG. 3A and explained below. This configuration suppresses the common-mode intensity noise as well as any mechanical and vibration noise present, and the resulting SBS frequency noise is shown in FIG. 6 (bottom trace). The measured noise decreases to 0.5 $Hz^2/Hz$ at 10 Hz offset frequency and yields a significantly reduced integrated linewidth of 2.6 Hz, which shows the ultimate potential for a Hertz-class SBS laser given that the residual common-mode noise is mitigated. From FIG. 6, the 30 dB ideal SBS suppression over the locked pump is also now apparent at all frequencies.

Conclusion

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of" or "exactly one of." "Consisting essentially of" when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A laser system to emit first stimulated Brillouin scattering (SBS) light and second SBS light, the laser system comprising:

a first pump laser to emit a first pump beam;

a modulator, in optical communication with the first pump laser, to modulate the first pump beam with an error-correction signal so as to stabilize a linewidth of the first SBS light;

a waveguide, in optical communication with the modulator, to guide the first pump beam from the modulator;

a resonator, coupled to the waveguide and having a thermal time constant of at least 1 second, to generate the first SBS light from a first portion of the first pump beam in a first polarization state;

a first photodetector, in optical communication with the resonator, to generate a photodetector signal in response to a second portion of the pump beam; and locking circuitry, operably coupled to the first photodetector, to generate the error-correction signal from the photodetector signal;

a second pump laser, in optical communication with the resonator, to generate a second pump beam, the resonator generating second SBS light in a second polarization state orthogonal to the first polarization state from a first portion of the second pump beam in the second polarization state;

a polarization controller, in optical communication with the resonator, to transform a second portion of the second pump beam from the second polarization state to the first polarization state;

a second photodetector, in optical communication with the polarization controller, to detect interference between the second portion of the first pump beam and the second portion of the second pump beam;

temperature-control circuitry, operably coupled to the second photodetector, to generate a temperature-control signal from the interference between the second portion of the first pump beam and the second portion of the second pump beam; and a heater, operably coupled to the temperature-control circuitry and in thermal communication with the resonator, to heat the resonator in response to the temperature-control circuitry.

2. The laser system of claim 1, wherein the resonator has a loss rate that equals a rate at which power is coupled out of the resonator.

3. The laser system of claim 1, wherein the resonator has a quality factor $Q>10^8$.

4. The laser system of claim 1, wherein the resonator comprises at least 2 meters of optical fiber.

5. The laser system of claim 4, wherein the resonator comprises up to about 20 meters of optical fiber.

6. The laser system of claim 1, wherein the resonator is integrated on a substrate.

7. The laser system of claim 1, wherein the resonator is critically coupled to the waveguide.

8. The laser system of claim 1, wherein the resonator is undercoupled to the waveguide.

9. The laser system of claim 1, wherein the thermal time constant of the resonator is at least 10 seconds.

10. The laser system of claim 1, wherein the first SBS light has a linewidth of about 100 Hz or less.

11. The laser system of claim 1, further comprising:

an optical amplifier, in optical communication with the modulator and the resonator, to amplify the first pump beam.

12. The laser system of claim 1, wherein the first portion of the first pump beam is coupled to a first mode of the resonator and the first portion of the second pump beam is coupled to a second mode of the resonator.

13. The laser system of claim 1, wherein the first pump laser is configured to emit the first pump beam at a first wavelength and the second pump laser is configured to emit the second pump beam at a second wavelength different than the first wavelength.

14. A method of emitting first stimulated Brillouin scattering (SBS) light and second SBS light, the method comprising:

coupling a first portion of a first pump beam in a first polarization state from a waveguide into a resonator with a thermal time constant of at least 1 second, the resonator generating the first SBS light in the first polarization state from the first portion of the first pump beam;

coupling the first SBS light out of the resonator;

sensing an amplitude of a second portion of the first pump beam;

generating an error-correction signal based on the amplitude of the second portion of the first pump beam; and modulating the pump beam based on the error-correction signal to reduce a linewidth of the SBS light;

coupling a first portion of a second pump beam in a second polarization state orthogonal to the first polarization state into the resonator, the resonator generating the second SBS light in the second polarization state from the first portion of the second pump beam;

coupling the second SBS light out of the resonator;

transforming a second portion of the second pump beam from the second polarization state to the first polarization state;

detecting interference between the second portion of the first pump beam and the second portion of the second pump beam; and heating the resonator in response to the interference between the second portion of the first pump beam and the second portion of the second pump beam.

15. The method of claim 14, wherein coupling the first portion of the first pump beam from the waveguide into the resonator comprises coupling about 1% to about 6% of the first pump beam from the waveguide into the resonator.

16. The method of claim 14, wherein modulating the first pump beam reduces the linewidth of the SBS light to about 100 Hz or less.

* * * * *